(12) United States Patent
Johnson (10) Patent No.: US 9,041,229 B1
(45) Date of Patent: May 26, 2015

(54) MERGED FIDUCIAL FOR SEMICONDUCTOR CHIP PACKAGES

(75) Inventor: Joseph G. Johnson, Mesa, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 303 days.

(21) Appl. No.: 13/608,544

(22) Filed: Sep. 10, 2012

(51) Int. Cl.
| | |
|---|---|
| H01L 23/544 | (2006.01) |
| H01L 23/52 | (2006.01) |
| H01L 23/48 | (2006.01) |
| H01L 23/485 | (2006.01) |
| H01L 23/498 | (2006.01) |
| H01L 23/00 | (2006.01) |

(52) U.S. Cl.
CPC .......... *H01L 23/49816* (2013.01); *H01L 24/81* (2013.01)

(58) Field of Classification Search
CPC .......................... H01L 24/81; H01L 23/49816
USPC ................... 257/797, 780, E23.021; 438/401
See application file for complete search history.

(56) References Cited

U.S. PATENT DOCUMENTS

| | | | | |
|---|---|---|---|---|
| 6,008,536 | A * | 12/1999 | Mertol | ........................... 257/704 |
| 6,403,401 | B1 | 6/2002 | Aquien et al. | |
| 6,468,361 | B1 | 10/2002 | Cantillep | |
| 6,638,831 | B1 * | 10/2003 | Roberts et al. | ................ 438/401 |
| 6,744,134 | B2 * | 6/2004 | Roberts et al. | ................ 257/708 |
| 6,954,360 | B2 * | 10/2005 | Nurminen | ..................... 361/704 |
| 7,307,443 | B2 | 12/2007 | Toh et al. | |

OTHER PUBLICATIONS

"Designing With High-Density BGA Packages for Altera Devices," Altera Corporation, Application AN-114-5.1, Dec. 2007, ver. 5.1, pp. 1-20, San Jose, CA.
"Pin numbering for various IC packages," Home Back, Feb. 5, 2005, www.amiga-stuff.com/hardware/pinumbering.html, pp. 1/4-4/4.

* cited by examiner

*Primary Examiner* — Luan C Thai
(74) *Attorney, Agent, or Firm* — McAndrews, Held & Malloy (57) ABSTRACT

Systems, manufactures, methods and/or techniques for a merged fiducial for chip packages are described. According to some embodiments, an integrated circuit package may include a package substrate having a first side and a second side, a plurality of conductive traces coupled to the first side and a plurality of balls disposed on the second side. The balls may be adapted to electrically connect the laminate package to a circuit board. The integrated circuit package may include a plurality of ball pads disposed on the second side, the ball pads being adapted to electrically connect the plurality of balls to the plurality of conductive traces. One or more of the ball pads may be uniquely shaped when compared to the rest of the plurality of ball pads, optionally, to serve as a fiducial to designate an A1 pin or ball of the laminate package.

20 Claims, 7 Drawing Sheets

MERGED FIDUCIAL FOR SEMICONDUCTOR CHIP PACKAGES

CROSS-REFERENCE TO RELATED APPLICATIONS

None.

FIELD

The present disclosure relates to fiducials for semiconductor chip scale packages, and more particularly to one or more systems, manufactures, methods, routines and/or techniques for a merged fiducial for chip scale packages.

BACKGROUND

As integrated circuits decrease in size and increase in complexity and density (more circuitry and I/O pins per area), the demand for small chip packages and diverse packaging options continues to grow. Increased device complexity and density further requires improved methods of accessing the semiconductor devices by means of the device input/output (I/O) connections.

BRIEF DESCRIPTION OF THE DRAWINGS

Several features and advantages are described in the following disclosure, in which several embodiments are explained, using the following drawings as examples.

DETAILED DESCRIPTION

As integrated circuits decrease in size and increase in complexity and density (more circuitry and I/O pins per area), the demand for small chip packages and diverse packaging options continues to grow. Increased device complexity and density further requires improved methods of accessing the semiconductor devices by means of the device input/output (I/O) connections. Two exemplary types of chip packages are laminate packages and wafer level chip scale packages (WLCSPs).

Laminate packages may, for example, consist of multiple layers that have been laminated together, typically using an epoxy. Each layer of such a laminate package may, for example, consist of a substrate (insulating layer) and a conducting layer, such as copper foil. The conducting material may be patterned, printed, etched and/or bonded onto the substrate, for example to form traces. Conducting materials or traces on separate layers of a laminate package may be connected by through hole or blind and buried plated vias. Laminate packages may have an array of pins or balls (e.g., a ball grid array (BGA) or land grid array (LGA)) on the bottom side that form an electrical connection with the circuit board to which the package will eventually be soldered. In order to facilitate an electrical connection between the pins or balls, and the conductive layers of the laminate package (and ultimately the integrated circuit), a bottom layer of the laminate package may include circular ball pads that are patterned, printed, etched and/or bonded onto the package substrate. In the example of LGA, these pads may be square or rectangular in shape, and the pads may be patterned, printed, etched and/or bonded onto the package substrate.

A wafer level chip scale package (WLCSP) is a package for an integrated circuit that is substantially the size of the integrated circuit, which may, for example, use a processing technique to apply layers of conductive and/or insulating materials to the integrated circuit or wafer. Some layers may be partially or fully etched or washed away after they have been applied. For example, some layers may be applied to form templates, and may be etched or washed away in a later step. A WLCSP may have an array of pins or balls (e.g., a ball grid array (BGA) or land grid array (LGA)) on the bottom side that form an electrical connection with the circuit board to which the package will eventually be soldered. In order to facilitate an electrical connection between the pins or balls, and the conductive layers of the WLCSP (and ultimately the integrated circuit), a circular, square or rectangular capture pad and/or an under bump metal (UBM) may, for example, be deposited or plated on the integrated circuit wafer, either directly on the wafer silicon or on top of one of the layers applied during the WLCSP processing.

Figure 1:
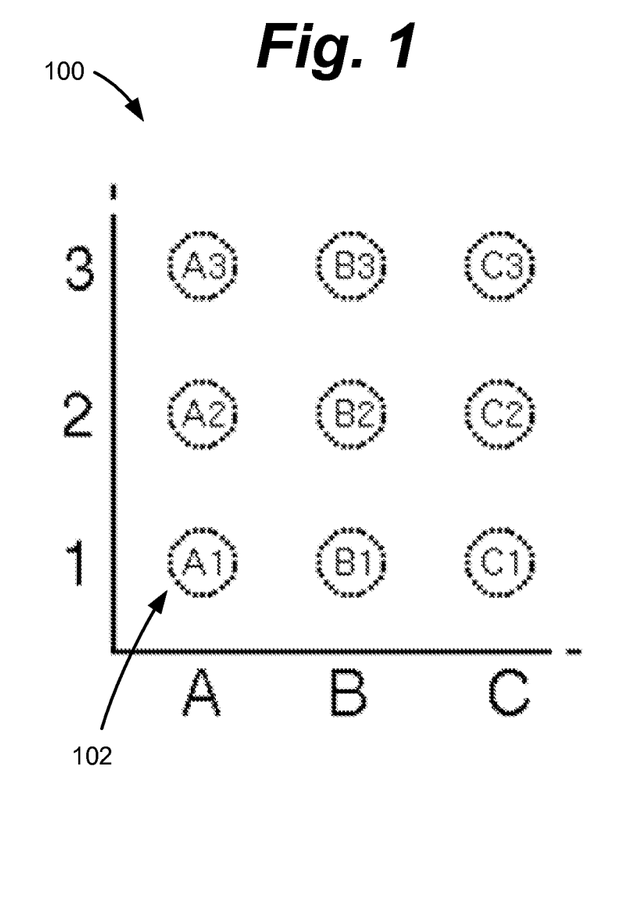
FIG. 1 depicts an illustration of an example scheme for identifying balls and/or pins of a chip scale package.

Chip packages (e.g., laminate packages, WLCSPs or other types of chip packages) may include one or more fiducial markers. A fiducial marker (or just fiducial) is an object or a mark that is visible in the final chip package, for use as a point of reference or a measure. A fiducial may be used to achieve a certain orientation of the chip, for example by a machine that will mount and/or solder a chip package to a circuit board. A fiducial may be either something placed into or on the package, or a mark or set of marks. Packages that include pins and/or balls on the bottom of the package, for example, to connect I/O ports, may include a scheme to identify and/or number the pins and/or balls, for example, using one or more fiducials. FIG. 1 shows an example scheme 100 for identifying pins, for example used in BGA (Ball Grid Array) packages. As can be seen in FIG. 1, columns of pins are indicated by letters and rows of pins by numbers. For example, pin 1 in column A may be identified by A1, referred to by number 102 in FIG. 1.

Figure 2:
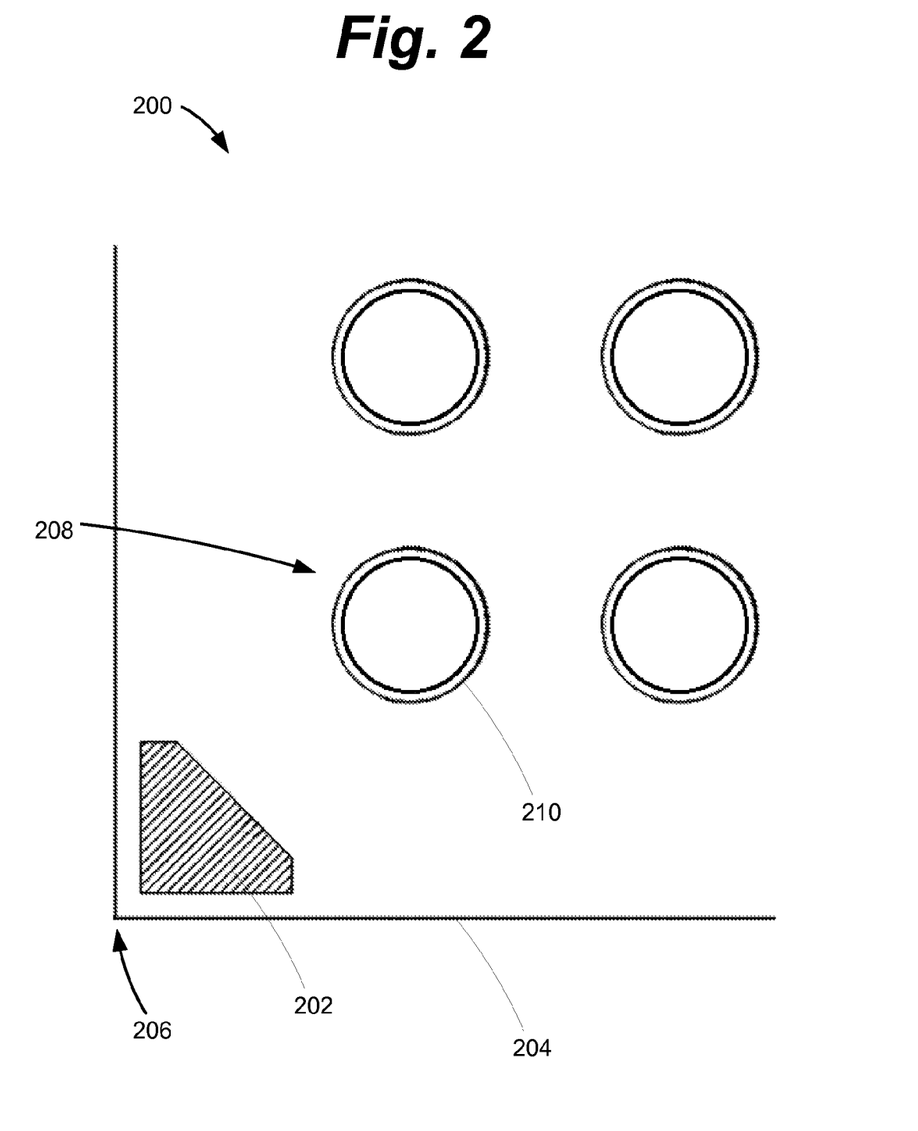
FIG. 2 depicts an illustration of a top-down or plan view of the bottom side of a chip package.

Various techniques include fiducials on the bottom side of chip packages, but they have disadvantages. Various techniques, for example used for laminate packages, include adding a small, thin piece of metal on the bottom layer of the package. The small piece of material is typically triangular shaped and is typically placed in a corner or quadrant of the chip package close to the A1 pin to indicate the A1 pin. The small piece of material is typically placed between the A1 pin and the closest corner of the chip package. In various techniques, the triangular shaped fiducial is a distinct or independent piece of metal from the metal ball pads that also reside on the same layer of substrate. FIG. 2 shows an illustration of a technique for including a fiducial on the bottom side of the chip package. FIG. 2 shows a top down or plan view 200 of the bottom side of a chip package. FIG. 2 shows a fiducial 202, a small, thin piece of metal, on the bottom layer of the chip package 204. The fiducial 202 is located near a corner 206 of the chip package 204, close to the A1 pin 208 to indicate the A1 pin. The fiducial 202 is placed between the A1 pin 208 and the closest corner 206 of the chip package 204. The fiducial 202 is a distinct or independent piece of metal from the metal ball pad 210 (of the A1 pin 208) that also reside on the same layer of substrate.

According to design rules followed by some makers of chip packages, the triangular shaped fiducial must maintain a certain distance from the ball pad. However, as chip packages become smaller and more dense with I/O ports, the array of balls on the bottom of the package becomes more dense, with the balls being packed closer together and the distance between the balls and the edges and/or corners of the package decreasing. As packages become denser, less space is available on the bottom of the package to include a fiducial. Some packages are so dense that various techniques for including a fiducial on the bottom of the package cannot be used. Makers of chip scale packages may find it difficult or impossible to add a fiducial to the bottom of the chip package while still conforming to their design rules and/or minimum spacing requirements.

One solution to handle dense packages may be to omit or exclude the fiducial on the bottom of the package; however, this has led to problems. As explained above, including a fiducial on the bottom of the chip package may be advantageous. In cases where the bottom fiducial is omitted, customers and/or machines may be unable to properly orient the chip relative to the circuit board. Additionally, the chip may not conform to industry standards. Some chip packages include clipped corners, however, clipping the corner requires an additional manufacturing step and adds cost to the process. Additionally, clipping the corner of the chip removes package real estate and/or integrated circuit real estate. Therefore a solution that allows for the inclusion of a fiducial on the bottom of a dense chip package is desirable.

The present disclosure describes one or more systems, manufactures, methods, routines and/or techniques for a merged fiducial for chip packages. In one or more embodiments, a fiducial may be merged with a ball pad, for example, the ball pad that electrically connects the A1 pin to one or more conductive traces of a laminate package. In one or more embodiments, a ball pad having a unique shape may be patterned, printed, etched and/or bonded onto the bottom substrate layer of a laminate package, where the unique shape of the ball pad serves as a fiducial. In these embodiments, the bottom of the chip package may mark one or more pins without the need for an additional/independent piece of triangular shaped metal placed near a corner of the chip package between the A1 pin and the corner of the package. In one or more embodiments, the uniquely-shaped ball pad or merged fiducial/ball pad may be patterned, printed, etched and/or bonded onto the bottom substrate layer of a laminate package in a similar manner and at the same time as the rest of the ball pads. The uniquely-shaped ball pad or merged fiducial/ball pad may serve as the ball pad for the ball that is intended to be marked, for example, pin A1, and it may reside on the same plane or laminate layer as other ball pads for other pins or balls.

In one or more embodiments, a fiducial may be merged with a capture pad and/or under bump metal (UBM), for example, the UBM that electrically connects the A1 pin or ball to one or more conductive layers of a wafer level chip scale package (WLCSP). In one or more embodiments, a UBM having a unique shape may be deposited or plated on an integrated circuit wafer (either directly on the wafer silicon or on top of one of the layers applied during the WLCSP processing), where the unique shape of the UBM or capture pad serves as a fiducial. In these embodiments, the bottom of the chip package may mark one or more pins without the need for an additional/independent piece of metal placed near a corner of the chip package between the A1 pin and the corner of the package. In one or more embodiments, the uniquely-shaped UBM or merged fiducial/UBM may be deposited or plated on an integrated circuit wafer (either directly on the wafer silicon or on top of one of the layers applied during the WLCSP processing) in a similar manner and at the same time as the rest of the UBMs. The uniquely-shaped UBM or merged fiducial/UBM may serve as the UBM for the ball that is intended to be marked, for example, pin A1, and it may reside on the same plane or layer as other UBMs for other pins or balls.

Figure 3:
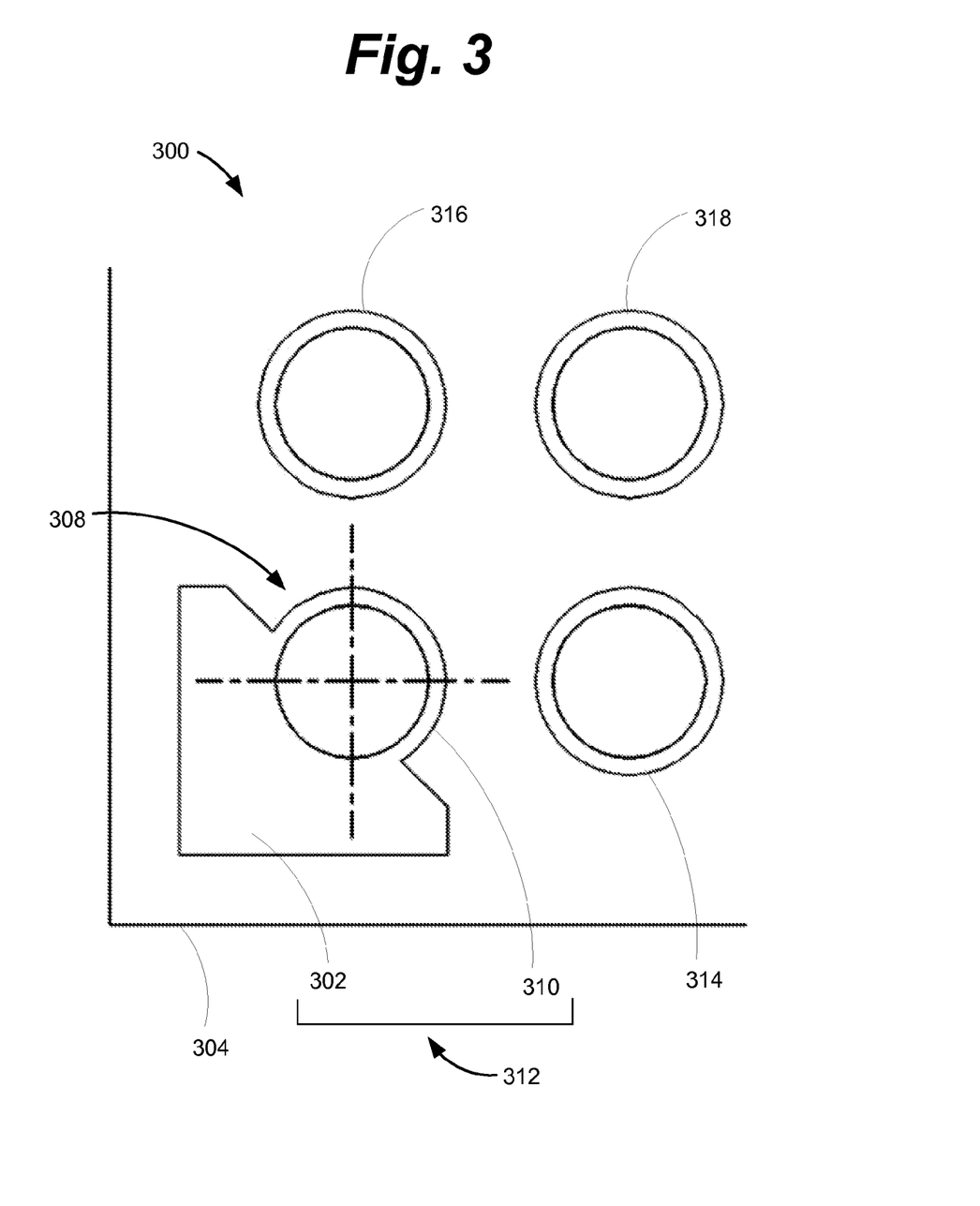
FIG. 3 depicts an illustration of a top-down or plan view of a portion of the bottom of an example chip package, according to one or more embodiments of the present disclosure.

FIG. 3 depicts an illustration of a top-down or plan view of a portion 300 of the bottom of an example chip package, according to one or more embodiments of the present disclosure. FIG. 3 shows a chip package 304 that includes a number of ball pads 310, 314, 316, 318 and a fiducial 302. Fiducial 302 may be substantially shaped like a triangle, for example, a triangle with two clipped corners that encompasses a portion of the nearest ball pad, as shown in FIG. 3. The fiducial 302 may be oriented such that the unclipped corner of the triangle points toward the nearest corner of the package 304. It should be understood that fiducial 302 may be formed into many different shapes. As can be seen in FIG. 3, fiducial 302 may be merged with a ball pad 310, for example, the ball pad that electrically connects the A1 pin 308 to one or more conductive traces of a laminate package. The merged fiducial 302 and ball pad 310 may be formed at the same time out of a continuous piece of material, or they may be formed independently and combined or merged. The merged fiducial 302 and ball pad 310 may be considered to be a single, uniquely-shaped ball pad 312. The merged fiducial 302 and/or ball pad 310 may be patterned, printed, etched and/or bonded onto the bottom substrate layer of chip package 304, for example, a laminate package. The uniquely-shaped ball pad 312 may serve as a fiducial, for example because its shape is visibly different from other ball pads 314, 316, 318 on the bottom of the chip package 304.

In one or more embodiments, for example as shown in FIG. 3, because the merged fiducial 302 and ball pad 310 (optionally referred to as a single uniquely-shaped ball pad 312) may be formed out of a single continuous piece of metal, for example copper (CU) or any conductive material, makers of chip packages may not be required to maintain minimum distances between the fiducial and ball pads as is required by some design rules. In these embodiments, the bottom of the chip package 304 may mark one or more pins, for example the A1 pin 308, without the need for an additional/independent piece of triangular shaped metal placed near a corner of the chip package between the A1 pin and the corner of the package (like shown in FIG. 2). In one or more embodiments, the uniquely-shaped ball pad 312 or merged fiducial 302 and ball pad 310 may be patterned, printed, etched and/or bonded onto the bottom substrate layer of a laminate package in a similar manner and at the same time as other ball pads 314, 316, 318. The uniquely-shaped ball pad 312 or merged fiducial 302/ball pad 310 may serve as the ball pad for the ball or pin that is intended to be marked by the fiducial, for example, pin A1 308. The uniquely-shaped fiducial 312 may reside on the same plane or laminate layer as other ball pads (for example, ball pads 314, 316, 318) for other pins or balls of the chip package 304.

FIGS. 4A-4E each depict an illustration of a top-down or plan view portion of the bottom of an example chip package, according to one or more embodiments of the present disclosure. The chip packages of FIGS. 4A-4E may be formed in a similar manner to the chip package of FIG. 3, and much or all of the description regarding FIG. 3 may apply to the chip packages of FIGS. 4A-4E. One difference between the chip packages of FIGS. 4A-4E and the chip package of FIG. 3 may be that the uniquely-shaped ball pad or the merged fiducial/ball pad may be differently shaped depending on the embodiment or figure.

Figure 4A:
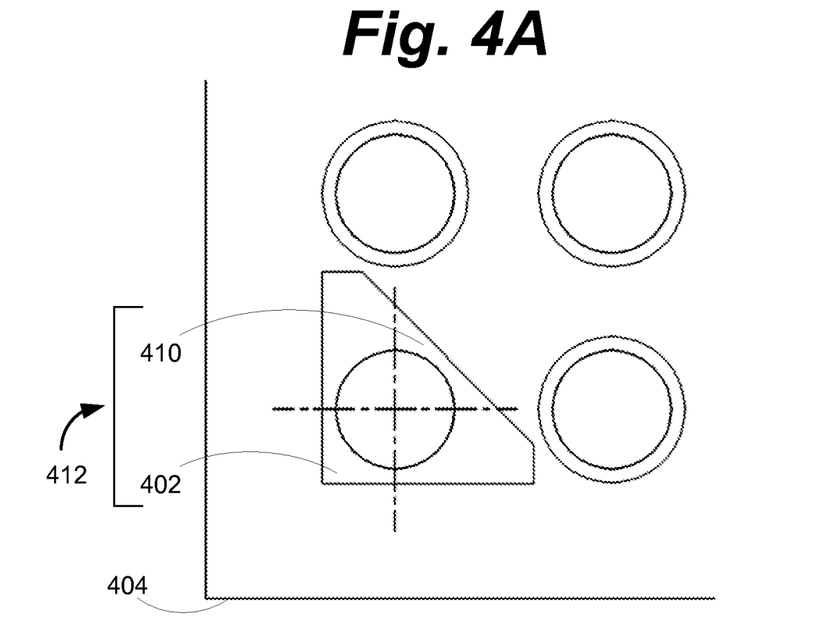
FIG. 4A depicts an illustration of a top-down or plan view of a portion of the bottom of an example chip package, according to one or more embodiments of the present disclosure.

FIG. 4A shows a chip package 404 that includes a number of ball pads and a fiducial 402. Fiducial 402 may be substantially shaped like a triangle, for example, a triangle with two clipped corners that fully encompasses the nearest ball pad, as shown in FIG. 4A. The fiducial 402 may be oriented such that the unclipped corner of the triangle points toward the nearest corner of the package 404. It should be understood that fiducial 402 may be formed into many different shapes. As can be seen in FIG. 4A, fiducial 402 may be merged with a ball pad 410. The merged fiducial 402 and ball pad 410 may be formed at the same time out of a continuous piece of material, or they may be formed independently and combined or merged. The merged fiducial 402 and ball pad 410 may be considered to be a single, uniquely-shaped ball pad 412.

Figure 4B:
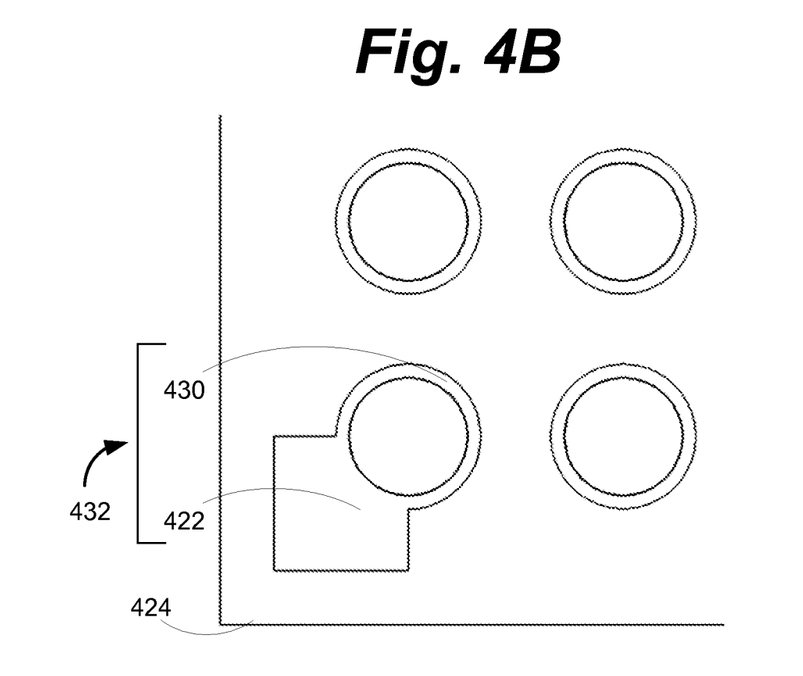
FIG. 4B depicts an illustration of a top-down or plan view of a portion of the bottom of an example chip package, according to one or more embodiments of the present disclosure.

FIG. 4B shows a chip package 424 that includes a number of ball pads and a fiducial 422. Fiducial 422 may be substantially shaped like a square, for example, a square that partially encompasses the nearest ball pad, as shown in FIG. 4B. The fiducial 422 may be oriented such that the flat sides of the square align with the nearest edges of the package 424. It should be understood that fiducial 422 may be formed into many different shapes. As can be seen in FIG. 4B, fiducial 422 may be merged with a ball pad 430. The merged fiducial 422 and ball pad 430 may be formed at the same time out of a continuous piece of material, or they may be formed independently and combined or merged. The merged fiducial 422 and ball pad 430 may be considered to be a single, uniquely-shaped ball pad 432.

Figure 4C:
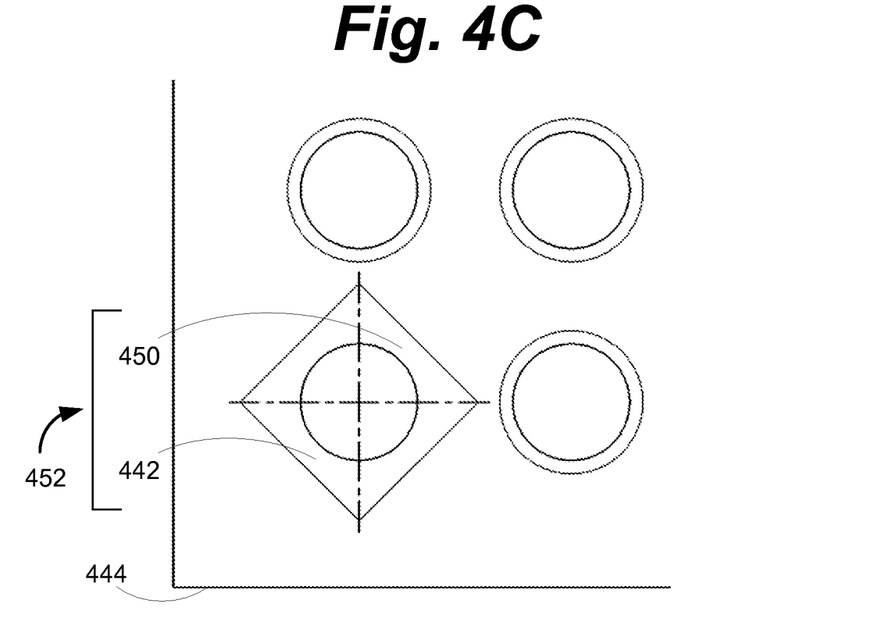
FIG. 4C depicts an illustration of a top-down or plan view of a portion of the bottom of an example chip package, according to one or more embodiments of the present disclosure.

FIG. 4C shows a chip package 444 that includes a number of ball pads and a fiducial 442. Fiducial 442 may be substantially shaped like a square, for example, a square that fully encompasses the nearest ball pad, as shown in FIG. 4C. The fiducial 442 may be oriented such that one flat sides of the square faces the nearest corner of the package 444. It should be understood that fiducial 442 may be formed into many different shapes. As can be seen in FIG. 4C, fiducial 442 may be merged with a ball pad 450. The merged fiducial 442 and ball pad 450 may be formed at the same time out of a continuous piece of material, or they may be formed independently and combined or merged. The merged fiducial 442 and ball pad 450 may be considered to be a single, uniquely-shaped ball pad 452.

Figure 4D:
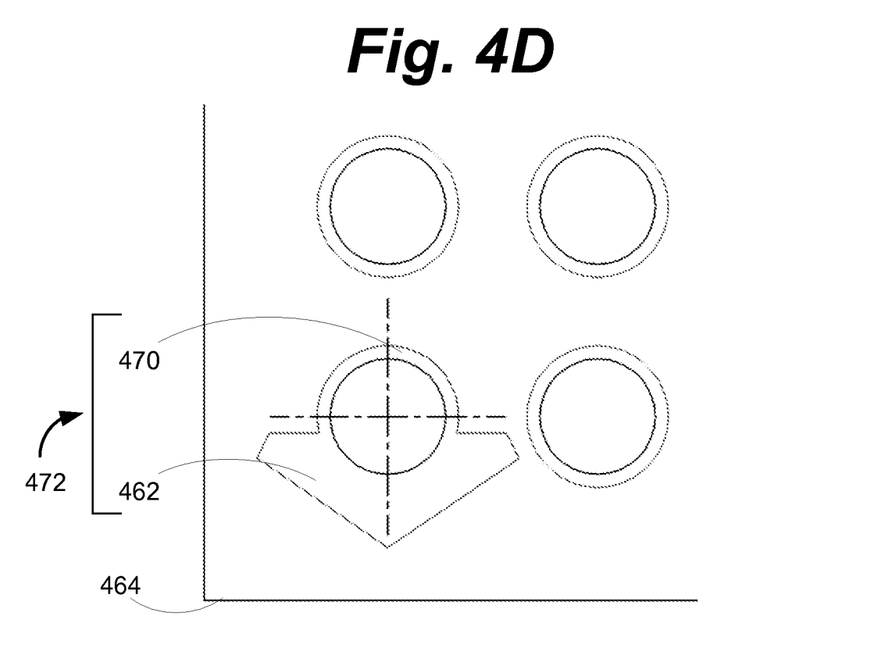
FIG. 4D depicts an illustration of a top-down or plan view of a portion of the bottom of an example chip package, according to one or more embodiments of the present disclosure.

FIG. 4D shows a chip package 464 that includes a number of ball pads and a fiducial 462. Fiducial 462 may be substantially shaped like a triangle, for example, a triangle with two clipped corners that partially encompasses the nearest ball pad, as shown in FIG. 4D. The fiducial 462 may be oriented such that one flat sides of the triangle faces the nearest corner of the package 464. It should be understood that fiducial 462 may be formed into many different shapes. As can be seen in FIG. 4D, fiducial 462 may be merged with a ball pad 470. The merged fiducial 462 and ball pad 470 may be formed at the same time out of a continuous piece of material, or they may be formed independently and combined or merged. The merged fiducial 462 and ball pad 470 may be considered to be a single, uniquely-shaped ball pad 472.

Figure 4E:
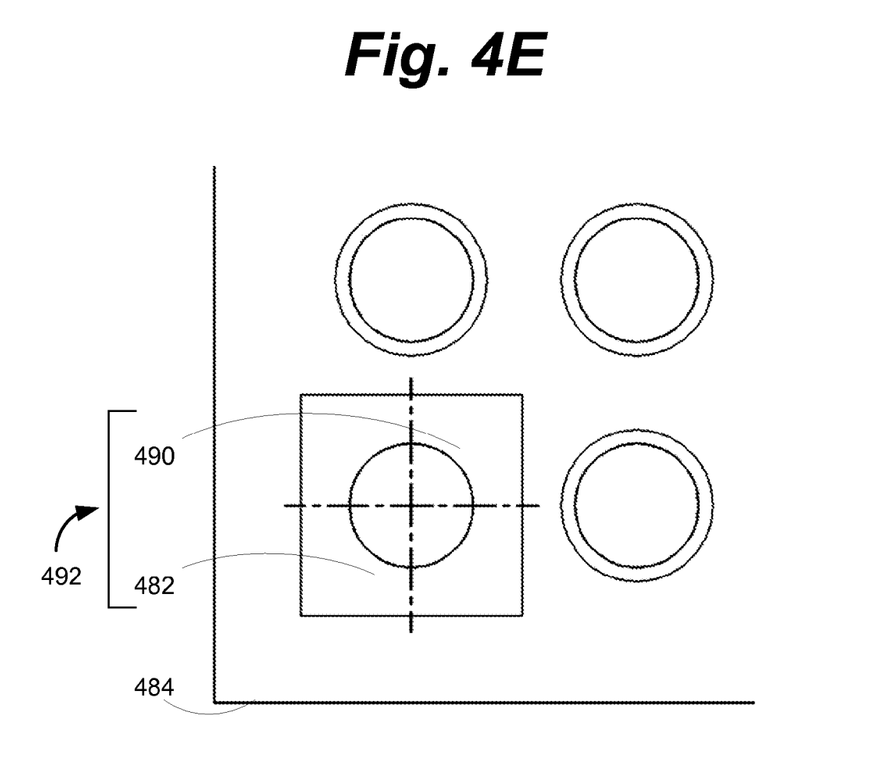
FIG. 4E depicts an illustration of a top-down or plan view of a portion of the bottom of an example chip package, according to one or more embodiments of the present disclosure.

FIG. 4E shows a chip package 484 that includes a number of ball pads and a fiducial 482. Fiducial 482 may be substantially shaped like a square, for example, a square that fully encompasses the nearest ball pad, as shown in FIG. 4E. The fiducial 482 may be oriented such that two flat sides of the square align with the nearest edges of the package 484. It should be understood that fiducial 482 may be formed into many different shapes. As can be seen in FIG. 4E, fiducial 482 may be merged with a ball pad 490. The merged fiducial 482 and ball pad 490 may be formed at the same time out of a continuous piece of material, or they may be formed independently and combined or merged. The merged fiducial 482 and ball pad 490 may be considered to be a single, uniquely-shaped ball pad 492.

Figure 5:
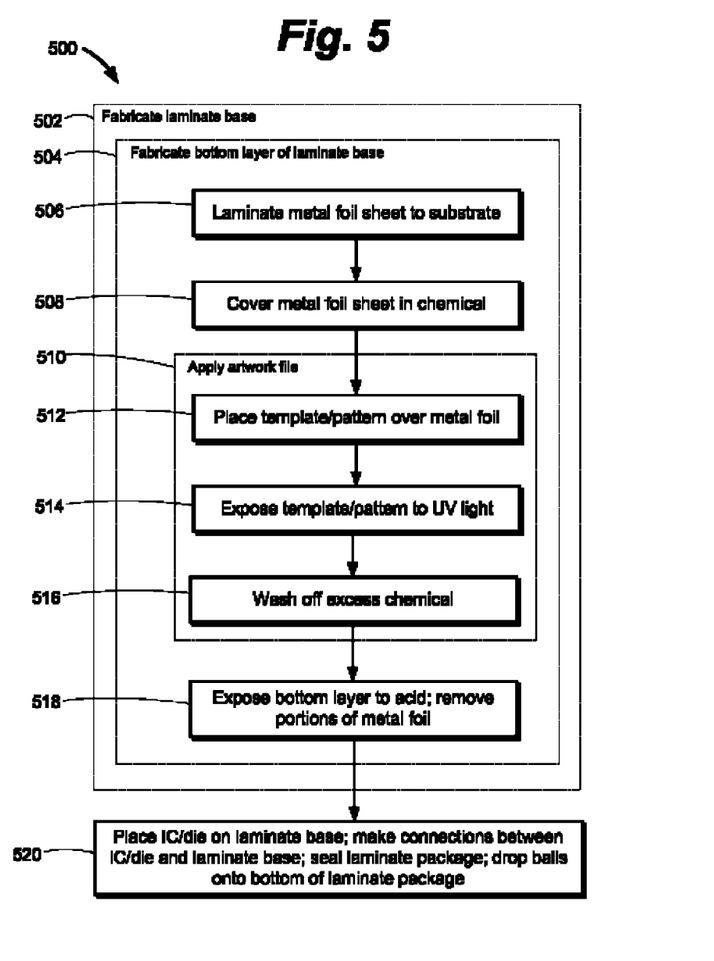
FIG. 5 depicts an illustration of a flow chart showing example steps in a method of forming a merged fiducial for chip packages, according to one or more embodiments of the present disclosure.

Certain embodiments of the present disclosure may be found in one or more methods of forming a merged fiducial for chip packages. FIG. 5 depicts an illustration of a flow chart 500 showing example steps in a method of forming a merged fiducial for chip packages, according to one or more embodiments of the present disclosure. It should be understood that, in some embodiments, one or more of the steps depicted in FIG. 5 may be performed in a different order than depicted. Additionally, in some embodiments, a method of forming a merged fiducial for chip packages may include more or less steps than are depicted in FIG. 5.

At step 502, a laminate base may be fabricated. Step 502 may include one or more sub-steps. At sub-step 504, the bottom layer of the laminate based may be fabricated. Sub-step 504 may include one or more sub-steps. At sub-step 506, a metal foil sheet may be laminated to a substrate to form the bottom layer of the laminate base. The metal foil sheet may be extremely thin, for example, having an almost negligible thickness. At sub-step 508, the metal foil sheet may be covered in a chemical. At stub-step 510, an artwork file or template (i.e., a clear and dark pattern) may be applied to or placed over the metal foil sheet that is covered in the chemical. In some examples, a photo plotter or other subtractive process may be used. It should be understood that, in some embodiments, an additive process could be used to apply the artwork file. Sub-step 510 may include one or more sub-steps.

Sub step 512 may include placing a template or pattern over the metal foil sheet and chemical. For some layers of the laminate base, the template or pattern may indicate where wiring or traces should run. For the bottom layer of the laminate base, the template or pattern may indicate where the ball pads and/or one or more fiducials should be located. In some embodiments of the present disclosure, the template or pattern may indicate where a merged fiducial and ball pad should be located. As one example, and referring to FIG. 3, if a pattern were placed over the portion 300, the pattern may be dark or solid at most or all parts except for the ball pads 310, 314, 316, 318 and the fiducial 302. In other words, the pattern may cover everything but the ball pads and fiducial, and clear sections of the pattern may expose the ball pads and fiducial.

Similar patterns may have dark and clear portions that expose other fiducial shapes, for example those shown in FIGS. 4A-4E.

Sub-step 514 may include exposing the template or pattern (with the metal foil sheet and chemical beneath it) to UV light. Metal foil portions that are exposed to the UV light (e.g., through clear portions of the template or pattern) may be cured or bonded to the substrate. As one example, and referring to FIG. 3, if a pattern were placed over the portion 300 with clear sections that expose the ball pads 310, 314, 316, 318 and the fiducial 302, the UV light may cure or bond the metal foil sheet to the substrate at the regions of the ball pads 310, 314, 316, 318 and the fiducial 302. At sub-step 516, the excess chemical may be washed off the bottom layer of the laminate. At sub-step 518, the bottom layer of the laminate may be exposed to an acid, thereby removing portions of the metal foil, for example, portions that did not cure to the substrate. As one example, and referring to FIG. 3, if a pattern were placed over the portion 300 that sheltered the whole portion 300 from UV light except for the ball pads 310, 314, 316, 318 and the fiducial 302, the acid may remove all portions of the metal foil except for the ball pads 310, 314, 316, 318 and the fiducial 302. Therefore, after step 518, metal foil layers or pieces may remain on the substrate to form the ball pads and the fiducial. Because the metal foil sheet may be extremely thin, the ball pads and/or fiducial may be extremely thin, for example, having an almost negligible thickness.

At step 520, an integrated circuit (IC) or die may be placed on the laminate base. Connections, such as wires and/or traces, may be made between the IC and the laminate base. The laminate base or package may be sealed, for example, by melting and/or molding plastic over the top of the IC and the laminate base. The plastic may form a lid or top to protect the IC or die inside the laminate package. Solder balls may be added to the bottom of the laminate base or package. The laminate base or package may be flipped over and, a solder ball may be dropped or deposited on top of each ball pad.

Certain embodiments of the present disclosure may be found in one or more methods of forming a merged fiducial for chip scale packages. The steps of forming a merged fiducial for chip scale packages may substantially follow CSP processing techniques known in the art, for example, to apply layers of conductive and/or insulating materials to the integrated circuit or wafer. Some layers may be partially or fully etched or washed away after they have been applied. For example, some layers may be applied and then partially etched or washed away to form templates. These layers may be fully etched or washed away in a later step. As one example, a photoresist (PR) layer may be deposited on top of a customer wafer. Then, a portion of the PR may be etched away to form a template within which a capture pad or under bump material (UBM) may be deposited. In one or more embodiments of the present disclosure, the PR layer may be etched away in a manner such that one or more templates are formed with a unique shape when compared to other templates on the same chip package. Once metal is plated within the templates, the uniquely shaped template(s) may result in one or more capture pads or UBMs with a unique shape when compared to other capture pads or UBMs on the same chip. In one or more embodiments of the present disclosure, metal may be deposited or plated within templates in a manner that causes one or more of the capture pads to have a resulting shape that is unique when compared to other capture pads on the same chip. A uniquely-shaped capture pad or UBM may serve as a fiducial, for example because its shape is visibly different from other capture pads or UBMs on the bottom of the chip package. In these embodiments, the bottom of the chip package may mark one or more pins, for example the A1 pin, without the need for an additional/independent marker.

Various embodiments of the present disclosure describe one or more systems, manufactures, methods and/or techniques for a merged fiducial for chip packages. According to some embodiments, an integrated circuit package may include a package substrate having a first side and a second side and a plurality of conductive traces coupled to (e.g., adhered to, formed on, etched on, etc.) the first side. The conductive traces may be adapted to electrically connect to a semiconductor die. The integrated circuit package may include a plurality of balls disposed on the second side, where the balls may be adapted to electrically connect the laminate package to a circuit board. The integrated circuit package may include a plurality of ball pads (for example, ball pads 310, 314, 316, 318) disposed on the second side, where the ball pads may be adapted to electrically connect the plurality of balls to the plurality of conductive traces. In some embodiments, the package substrate may be a laminate substrate. In some embodiments, the integrated circuit package may include at least one semiconductor die coupled to the first side of the package substrate.

One or more of the ball pads (for example, uniquely-shaped ball pad 312) may be uniquely shaped when compared to the rest of the plurality of ball pads. In some embodiments of the present disclosure, the one or more uniquely shaped ball pads each consist of a continuous piece of copper. In some embodiments, one of the one or more uniquely shaped ball pads (for example, uniquely-shaped ball pad 312) serves as a fiducial to designate an A1 pin (for example, A1 pin 102) or ball of the laminate package. In some embodiments, one of the one or more uniquely shaped ball pads is substantially shaped like a triangle (for example, uniquely-shaped ball pad 312, 412, 472). In some embodiments, one of the one or more uniquely shaped ball pads (for example, uniquely-shaped ball pad 312) includes a fiducial portion (for example, fiducial portion 302) that is substantially shaped like a triangle, and wherein the triangle shaped fiducial portion partially encompasses or merges with a circular remainder portion (for example, remainder portion 310) of the ball pad. In some embodiments, the fiducial portion (for example, fiducial portion 302) is oriented such that a corner of the triangle points toward the nearest corner of the laminate package (for example, laminate package 304). In some embodiments, one of the one or more uniquely shaped ball pads (for example, uniquely-shaped ball pad 432, 452, 492) is substantially shaped like a square. In some embodiments, one of the one or more uniquely shaped ball pads (for example, uniquely-shaped ball pad 432) includes a fiducial portion (for example, fiducial portion 422) that is substantially shaped like a square, and wherein the square shaped fiducial portion partially encompasses or merges with a circular remainder portion (for example, remainder portion 430) of the ball pad.

According to one or more embodiments of the present disclosure, a method of forming an integrated circuit package may include fabricating a package substrate having a first side and a second side and forming a plurality of conductive traces that become coupled to (e.g., adhered to, formed on, etched on, etc.) the first side. The conductive traces may be adapted to electrically connect to a semiconductor die. The method of forming an integrated circuit package may include disposing a plurality of balls on the second side, where the balls may be adapted to electrically connect the laminate package to a circuit board. The method of forming an integrated circuit package may include forming a plurality of ball pads (for example, ball pads 310, 314, 316, 318) on the second side, where the ball pads may be adapted to electrically connect the plurality of balls to the plurality of conductive traces. The plurality of ball pads may be formed in a manner such that one or more of the ball pads (for example, uniquely-shaped ball pad 312) may have a unique shape when compared to the rest of the plurality of ball pads. In some embodiments, one of the one or more uniquely shaped ball pads serves as a fiducial to designate an A1 pin (for example, A1 pin 102) or ball of the laminate package. In some embodiments, one of the one or more uniquely shaped ball pads (for example, uniquely-shaped ball pad 312) is substantially shaped like a triangle. In some embodiments, one of the one or more uniquely shaped ball pads includes a fiducial portion (for example, fiducial portion 302) that is substantially shaped like a triangle, and wherein the triangle shaped fiducial portion partially encompasses or merges with a circular remainder portion (for example, remainder portion 310) of the ball pad. In some embodiments, one of the one or more uniquely shaped ball pads (for example, uniquely-shaped ball pad 432) is substantially shaped like a square.

In some embodiments, the step of the method for forming a plurality of ball pads may include laminating a metal foil sheet to the second side of the package substrate and placing a template over the metal foil sheet. The template may include substantially clear portions and substantially dark or opaque portions. The step of forming a plurality of ball pads may further include exposing the template to UV light. Portions of the metal foil sheet that are exposed to the UV light through clear portions of the template may be cured or bonded to the substrate. Portions of the metal foil sheet that are bonded to the substrate may form the plurality of ball pads. Each of the plurality of ball pads may be associated with a respective logical pin.

According to one or more embodiments of the present disclosure, a substrate having a first side and a second side may include a plurality of conductive traces coupled to (e.g., adhered to, formed on, etched on, etc.) the first side, where the conductive traces may be adapted to electrically connect to a semiconductor die. The substrate may include a plurality of balls disposed on the second side, where the balls may be adapted to electrically connect the laminate package to a circuit board. The substrate may include a plurality of ball pads (for example, ball pads 310, 314, 316, 318) disposed on the second side, where the ball pads may be adapted to electrically connect the plurality of balls to the plurality of conductive traces. One or more of the ball pads (for example, uniquely-shaped ball pad 312) may be uniquely shaped when compared to the rest of the plurality of ball pads. In some embodiments, one of the one or more uniquely shaped ball pads serves as a fiducial to designate an A1 pin (for example, A1 pin 102) or ball of the laminate package. In some embodiments, one of the one or more uniquely shaped ball pads (for example, uniquely-shaped ball pad 312) is substantially shaped like a triangle. In some embodiments, one of the one or more uniquely shaped ball pads includes a fiducial portion (for example, fiducial portion 302) that is substantially shaped like a triangle, and wherein the triangle shaped fiducial portion partially encompasses or merges with a circular remainder portion (for example, remainder portion 310) of the ball pad.

Descriptions of the different advantageous embodiments have been presented for purposes of illustration and description and are not intended to be exhaustive or limited to the embodiments in the form disclosed. Many modifications and variations will be apparent to those of ordinary skill in the art. Further different advantageous embodiments may provide different advantages as compared to other advantageous embodiments. The embodiment or embodiments selected are chosen and described in order to best explain the principles of the embodiments the practical application and to enable others of ordinary skill in the art to understand the disclosure for various embodiments with various modifications as are suited to the particular use contemplated.

The invention claimed is:

1. An integrated circuit package, comprising:
   a package substrate having a first side and a second side;
   a plurality of conductive traces coupled to the first side, the conductive traces being adapted to electrically connect to a semiconductor die;
   a plurality of balls disposed on the second side, the balls being adapted to electrically connect the integrated circuit package to a circuit board; and
   a plurality of ball pads disposed on the second side, the ball pads being adapted to electrically connect the plurality of balls to the plurality of conductive traces,
   wherein one or more of the ball pads is uniquely shaped when compared to the rest of the plurality of ball pads and is a fiducial for the integrated circuit package.

2. The integrated circuit package of claim 1, wherein the package substrate is a laminate substrate.

3. The integrated circuit package of claim 1, comprising at least one semiconductor die coupled to the first side of the package substrate.

4. The laminate package of claim 1, wherein the one or more uniquely shaped ball pads each consist of a continuous piece of copper.

5. The laminate package of claim 1, wherein one of the one or more uniquely shaped ball pads serves is a fiducial to designate an A1 pin or ball of the integrated circuit package.

6. The laminate package of claim 1, wherein one of the one or more uniquely shaped ball pads is substantially shaped like a triangle.

7. The laminate package of claim 1, wherein one of the one or more uniquely shaped ball pads includes a fiducial portion that is substantially shaped like a triangle, and wherein the triangle shaped fiducial portion partially encompasses or merges with a circular remainder portion of the ball pad.

8. The laminate package of claim 7, wherein the fiducial portion is oriented such that a corner of the triangle points toward the nearest corner of the integrated circuit package.

9. The laminate package of claim 1, wherein one of the one or more uniquely shaped ball pads is substantially shaped like a square.

10. The laminate package of claim 1, wherein one of the one or more uniquely shaped ball pads includes a fiducial portion that is substantially shaped like a square, and wherein the square shaped fiducial portion partially encompasses or merges with a circular remainder portion of the ball pad.

11. A method of forming an integrated circuit package, the method comprising:
   fabricating a package substrate having a first side and a second side;
   forming a plurality of conductive traces that become coupled to the first side, the conductive traces being adapted to electrically connect to a semiconductor die;
   disposing a plurality of balls on the second side, the balls being adapted to electrically connect the integrated circuit package to a circuit board; and
   forming a plurality of ball pads on the second side, the ball pads being adapted to electrically connect the plurality of balls to the plurality of conductive traces,
   wherein the plurality of ball pads are formed in a manner such that one or more of the ball pads has a unique shape when compared to the rest of the plurality of ball pads and is a fiducial for the integrated circuit package.

12. The method of claim 11, wherein the step of forming a plurality of ball pads comprises:
  laminating a metal foil sheet to the second side of the package substrate;
  placing a template over the metal foil sheet, wherein the template comprises substantially clear portions and substantially dark or opaque portions; and
  exposing the template to UV light, wherein:
  portions of the metal foil sheet that are exposed to the UV light through clear portions of the template are cured or bonded to the package substrate;
  portions of the metal foil sheet that are bonded to the substrate form said plurality of ball pads, each of said plurality of ball pads being associated with a respective logical pin.

13. The method of claim 11, wherein one of the one or more uniquely shaped ball pads is a fiducial to designate an A1 pin or ball of the integrated circuit package.

14. The method of claim 11, wherein one of the one or more uniquely shaped ball pads is substantially shaped like a triangle.

15. The method of claim 11, wherein one of the one or more uniquely shaped ball pads includes a fiducial portion that is substantially shaped like a triangle, and wherein the triangle shaped fiducial portion partially encompasses or merges with a circular remainder portion of the ball pad.

16. The method of claim 11, wherein one of the one or more uniquely shaped ball pads is substantially shaped like a square.

17. A substrate having a first side and a second side, the substrate comprising:
  a plurality of conductive traces coupled to the first side, the conductive traces being adapted to electrically connect to a semiconductor die;
  a plurality of balls disposed on the second side, the balls being adapted to electrically connect the substrate to a circuit board; and
  a plurality of ball pads disposed on the second side, the ball pads being adapted to electrically connect the plurality of balls to the plurality of conductive traces,
  wherein one or more of the ball pads is uniquely shaped when compared to the rest of the plurality of ball pads and is a fiducial for the integrated circuit package.

18. The substrate of claim 17, wherein one of the one or more uniquely shaped ball pads is a fiducial to designate an A1 pin or ball of the substrate.

19. The substrate of claim 17, wherein one of the one or more uniquely shaped ball pads is substantially shaped like a triangle.

20. The substrate of claim 17, wherein one of the one or more uniquely shaped ball pads includes a fiducial portion that is substantially shaped like a triangle, and wherein the triangle shaped fiducial portion partially encompasses or merges with a circular remainder portion of the ball pad.

\* \* \* \* \*